United States Patent
Katchmart

(10) Patent No.: US 12,206,753 B1
(45) Date of Patent: Jan. 21, 2025

(54) UNIFIED TIME BASE FOR STORAGE DEVICE DATA CHANNEL

(71) Applicant: Marvell Asia Pte Ltd, Singapore (SG)

(72) Inventor: Supaket Katchmart, San Jose, CA (US)

(73) Assignee: Marvell Asia Pte Ltd, Singapore (SG)

(*) Notice: Subject to any disclaimer, the term of this patent is extended or adjusted under 35 U.S.C. 154(b) by 148 days.

(21) Appl. No.: 18/053,465

(22) Filed: Nov. 8, 2022

Related U.S. Application Data

(60) Provisional application No. 63/400,776, filed on Aug. 25, 2022.

(51) Int. Cl.
*H04L 7/00* (2006.01)
*G11B 20/14* (2006.01)
*H03L 7/087* (2006.01)

(52) U.S. Cl.
CPC .......... *H04L 7/0008* (2013.01); *G11B 20/14* (2013.01); *H03L 7/087* (2013.01)

(58) Field of Classification Search
CPC ........ H04L 7/0008; G11B 20/14; H03L 7/087
See application file for complete search history.

(56) References Cited

U.S. PATENT DOCUMENTS

| | | | | |
|---|---|---|---|---|
| 4,835,623 A | * | 5/1989 | Okano | H04N 9/877 386/E9.052 |
| 4,996,608 A | * | 2/1991 | Widney | G11B 5/59633 331/177 V |
| 10,832,716 B2 | | 11/2020 | Katchmart | |
| 10,936,003 B1 | * | 3/2021 | Wu | G11B 20/10055 |
| 10,971,187 B2 | | 4/2021 | Katchmart | |
| 11,087,788 B1 | | 8/2021 | Katchmart | |
| 2004/0201913 A1 | * | 10/2004 | Sutardja | G11B 20/10 |

* cited by examiner

*Primary Examiner* — Sam K Ahn

(57) ABSTRACT

A method of clocking a data channel of a storage device includes generating a single time-base frequency signal, deriving from the single time-base frequency signal, using a plurality of frequency-modification techniques, a plurality of individual clock signals, each respective one of the individual clock signals being for clocking a respective one of reading, writing and servo functions of the data channel. When the storage device is a disk storage device having a rotational frequency, generating a single time-base frequency signal may include generating a time-base frequency signal based on the rotational frequency. Deviation of the single time-base frequency from the rotational frequency may be detected, and the deviation may be compensated for. Each technique of the frequency-modification techniques may be a digital frequency-modification technique, such as a digital timing recovery technique or a digital frequency division technique.

17 Claims, 7 Drawing Sheets

UNIFIED TIME BASE FOR STORAGE DEVICE DATA CHANNEL

CROSS REFERENCE TO RELATED APPLICATION

This disclosure claims the benefit of copending, commonly-assigned United States Provisional Patent Application No. 63/400,776, filed Aug. 25, 2022, which is hereby incorporated by reference herein in its entirety.

FIELD OF USE

This disclosure relates to data channel operations in storage devices such as disk drives. More particularly, this disclosure relates to provision of a unified time base for data channel operations in disk drives.

BACKGROUND

The background description provided herein is for the purpose of generally presenting the context of the disclosure. Work of the inventor hereof, to the extent the work is described in this background section, as well as aspects of the description that may not otherwise qualify as prior art at the time of filing, are neither expressly nor impliedly admitted to be prior art against the subject matter of the present disclosure.

In magnetic recording, as one example, reading and writing are performed by one or more heads that move relative to the surface of a storage medium. Magnetic disk drives, for example, include a one or more individual disks, or "platters," which may be two-sided—i.e., each platter can store data on each of its two sides. Therefore, such a disk drive would have at least two heads for each platter. Indeed, for each platter, there is normally at least one write head and at least one separate read head, so that such a disk drive normally has at least four heads per platter.

In a common configuration, all of the heads in a given disk drive are mounted on arms attached to a common actuator that controls the radial position of the heads (an angular, tangential or circumferential component of motion is provided by the rotation of the platters relative to the heads). This is true whether there is one or many platters, and one or multiple heads per platter.

In order to control the radial position selected by the actuator, each surface of each platter has distributed upon it positional information referred to as "servo" data. The servo data are commonly distributed in spaced-apart servo "wedges" (generally spaced equiangularly) on the platter surface. By reading the servo data as each servo wedge passes under the read head, the disk drive controller can determine the precise radial (and angular) position of the head and can feed back that determination to control the position of the read head or the write head, depending on the required operation.

In typical implementations, reading and writing operations (including servo operations) are processed at frequencies generated by multiple time base generators, even though they may be based on a common reference frequency (such as a crystal oscillator that may be locked to the disk rotational frequency). Indeed, there may be three or four time base generators in the circuitry that handles reading and writing in a storage medium, leading to multiple potential sources of jitter.

SUMMARY

In accordance with implementations of the subject matter of this disclosure, a method of clocking a data channel of a storage device includes generating a single time-base frequency signal, deriving from the single time-base frequency signal, using a plurality of frequency-modification techniques, a plurality of individual clock signals, each respective one of the individual clock signals being for clocking a respective one of reading, writing and servo functions of the data channel.

In a first implementation of such a method, when the storage device is a disk storage device having a rotational frequency, generating a single time-base frequency signal may include generating a time-base frequency signal based on the rotational frequency.

A first aspect of that first implementation may further include detecting a deviation of the single time-base frequency from the rotational frequency, and compensating for the deviation.

In a first instance of that first aspect, detecting the deviation of the single time-base frequency from the rotational frequency may include detecting a time interval between servo wedges, and compensating for the deviation may include determining a scale factor based on a relationship of the deviation to a period of the single time-base frequency, and applying the scale factor to each individual clock signal in the plurality of clock signals.

In a second instance of that first aspect, detecting a deviation of the single time-base frequency from the rotational frequency may include detecting a servo sync mark at a time other than a time expected based on the rotational frequency, and compensating for the deviation may include deriving a phase differential from the deviation and applying the phase differential to the single time-base frequency.

In a third instance of that first aspect, detecting a deviation of the single time-base frequency from the rotational frequency may include detecting a skipped clock using digital timing recovery, and compensating for the deviation may include deriving a phase differential from the deviation and applying the phase differential to the single time-base frequency.

According to a second aspect of that first implementation, each technique in the plurality of frequency-modification techniques may be a digital frequency-modification technique.

In a first instance of that second aspect, one of the digital frequency-modification techniques may be a write pattern frequency modification technique requiring bit repetition for modification of write phase, and the method may further include oversampling the time-base frequency in portions of the data channel to provide the bit repetition.

A variation of that first instance may further include adjusting the write pattern frequency on a per-sector basis to account for variations in disk surface quality.

In a second instance of that second aspect, one of the digital frequency-modification techniques may be a digital timing recovery technique.

In a third instance of that second aspect, one of the digital frequency-modification techniques may be a digital frequency division technique.

According to implementations of the subject matter of this disclosure, a storage device includes a storage medium on which data is written, and a data channel including clock circuitry. The clock circuitry includes circuitry configured to generate a single time-base frequency signal, and circuitry configured to derive from the single time-base frequency signal, using a plurality of frequency-modification techniques, a plurality of individual clock signals, each respective one of the individual clock signals being for clocking a respective one of reading, writing and servo functions of the data channel.

In a first implementation of such a storage device, the storage medium may be a disk having a rotational frequency, and the circuitry configured to generate a single time-base frequency signal may be configured to generate a single time-base frequency signal based on the rotational frequency.

According to a first aspect of that first implementation, the circuitry configured to generate a single time-base frequency signal may include a phase-locked loop.

A second aspect of that first implementation may further include circuitry configured to detect a deviation of the single time-base frequency from the rotational frequency, and circuitry configured to compensate for the deviation.

In a first instance of that second aspect, the circuitry configured to detect the deviation of the single time-base frequency from the rotational frequency may include circuitry configured to detect a time interval between servo wedges, and the circuitry configured to compensate for the deviation may include circuitry configured to determine a scale factor based on a relationship of the deviation to a period of the single time-base frequency, and circuitry configured to apply the scale factor to each individual clock signal in the plurality of clock signals.

In a second instance of that second aspect, the circuitry configured to detect the deviation of the single time-base frequency from the rotational frequency may include circuitry configured to detect a servo sync mark at a time other than a time expected based on the rotational frequency, and the circuitry configured to compensate for the deviation may include circuitry configured to derive a phase differential from the deviation and to apply the phase differential to the single time-base frequency.

In a third instance of that second aspect, the circuitry configured to detect the deviation of the single time-base frequency from the rotational frequency may include circuitry configured to detect a skipped clock using digital timing recovery, and the circuitry configured to compensate for the deviation may include circuitry configured to derive a phase differential from the deviation and to apply the phase differential to the single time-base frequency.

According to a third aspect of that first implementation, the circuitry configured to derive, from the single time-base frequency signal, the plurality of individual clock signals, may be digital frequency-modification circuitry.

In a first instance of that third aspect, the digital frequency-modification circuitry may include oversampling circuitry to provide bit repetition in the time-base frequency in portions of the data channel, and write pattern frequency modification circuitry configured to operate on repetitive bits to modify the write phase.

In a first variation of that first instance, the write pattern frequency modification circuitry may be further configured to adjust the write pattern frequency on a per-sector basis to account for variations in disk surface quality.

In a second instance of that third aspect, the digital frequency-modification circuitry may include digital timing recovery circuitry.

In a third instance of that third aspect, the digital frequency-modification circuitry may include digital frequency division circuitry.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
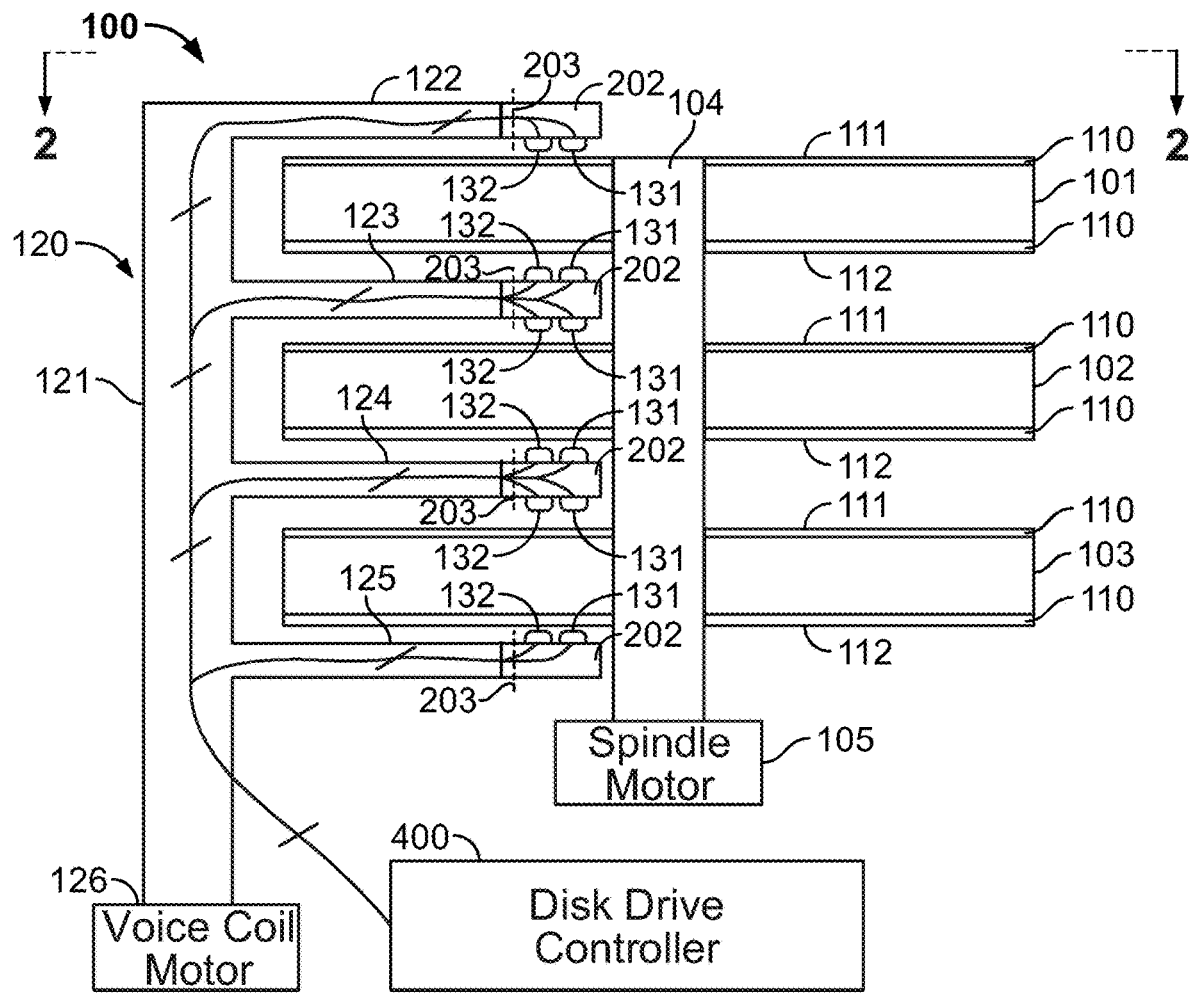
FIGS. 1 and 2 show an example of a disk drive 100 with which the subject matter of the present disclosure may be used.

As described above, in typical disk drive implementations, reading and writing operations (including servo operations) are processed at frequencies derived generated by multiple time base generators, even though they may be based on a common reference frequency (such as a crystal oscillator that may be locked to the disk rotational frequency). Indeed, there may be three or four time base generators in the circuitry that handles reading and writing in a storage medium, leading to multiple potential sources of jitter as signals cross from one time domain to another.

Therefore, in accordance with implementations of the subject matter of this disclosure, while different clocks may be derived by different portions of the data channel circuitry (which controls reading, writing and servo operations), all clocks ultimately are derived from a single time-base generator, and various techniques are used to derive the various clocks that are used for read, write and servo operations. In various implementations, the clock derivation techniques may be digital.

For example, in some typical implementations, three time-base generators, commonly based on phase-locked loops (PLLs), may have been provided. In one typical implementation, one time-base generator, sometimes referred to as TBG, provided the source for clocking the read channel and the write channel, as well as for deriving a clock for servo write operations. A second time-base generator, sometimes referred to as SFG (servo function generator), provided the source for clocking servo read operations, which may have included disk-synchronous write operations to compensate for deviations of the clock frequency from the disk rotational frequency to keep the SFG time-base synchronous with the disk rotational frequency. A third time-base generator, sometimes referred to as BFG (back-end function generator), may have been used to provide the source for clocking certain back-end disk functions such as error correction. Finally, in some implementations an AHB clock—i.e., an AMBA (Advanced Microcontroller Bus Architecture) High-performance Bus clock—also may have been provided for clocking, e.g., direct-memory access (DMA) transactions between the disk drive and a host device.

In accordance with implementations of the subject matter of this disclosure, at least the TBG, SFG and BFG time-base sources can be replaced by a single time-base generator, the output of which may be processed—e.g., digitally—to provide all of the desired clocks. Generally, the single time-base generator will be configured to provide an output with a frequency at least equal to the highest frequency needed, so that all clocks can be provided by deriving a lower frequency from the time-base generator frequency. In addition, the AHB clock may continue to be provided separately by the host device.

The various frequencies derived from the single time-base may be very different from one another. For example, as discussed below, a frequency modification technique may be used that allows each derived frequency to be any rational multiple of the time-base frequency. Thus, for all practical purposes, the various frequencies in some implementations may be considered effectively asynchronous. Nevertheless, because there is only one time-base generator, there is only one time domain in the system, and therefore time-domain crossings, which are major sources of jitter, are absent from the system. While there may still be phase variances among the different clocks derived from the time-base generator (e.g., based on when a servo-sync mark is detected), those phase variances may be less than one clock period, and may be knowable so that they can be accounted for.

The subject matter of this disclosure may be better understood by reference to FIGS. 1-8.

Figure 2:
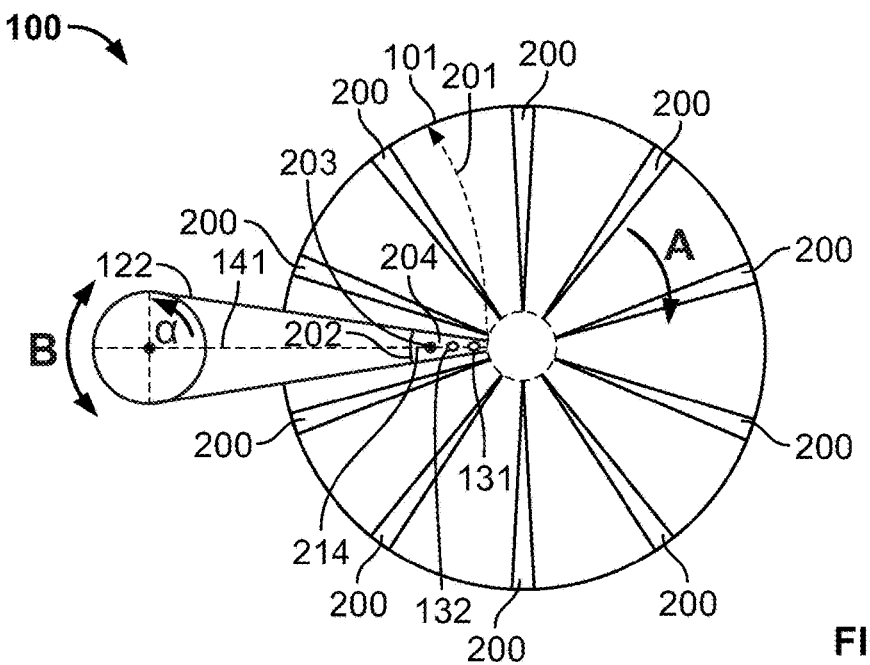

FIGS. 1 and 2 show an example of a disk drive 100 with which the subject matter of the present disclosure may be used. In this particular example, disk drive 100 has three platters 101, 102, 103, although any number of platters may be included in a disk drive with which the subject matter of the present disclosure may be used. As shown, each platter 101, 102, 103 has, on each of its upper and lower surfaces 111, 112, a coating 110 made from a material in which data can be stored, e.g., magnetically. The present disclosure also is relevant to a disk drive in which one or more platters includes coating 110 on only one of its surfaces, but such a disk drive would store less data in the same volume than a disk drive with two-sided platters. The platters 101-103 are mounted on a rotatable spindle 104. Motor 105 rotates spindle 104 to rotate platters 101-103 in the direction of arrow A (FIG. 2). Although motor 105 is shown connected directly to spindle 104, in some cases motor 105 may be located off-axis of spindle 104 and would be connected to spindle 104 through belts or gears (not shown).

Read/write head assembly 120 includes an actuator 121 that bears arms 122-125, one of which is disposed adjacent to each surface 111, 112 of a platter 101, 102, 103 that has a memory storage coating 110. In this example, with heads on both surfaces of each of arms 123, 124, that amounts to four arms 122-125, but in the single-sided platter example discussed above, there would be only three arms. In other examples, the number of arms would increase or decrease along with the number of platters.

Each arm 122-125 bears, at or near its end furthest from actuator 121, and on both its upper and lower surfaces in the case of arms 123, 124, a plurality of read heads/sensors and write heads. In this case, two sensors 131, 132 are shown, and may represent, respectively, read and write sensors, although it in some applications each arm 123, 124 may bear more than one read head/sensor and more than one write head (not shown). In the configuration shown in FIGS. 1 and 2, arms 122-125 are aligned along a radius of platters 101-103, bringing heads 131, 132 as close as they can get to spindle 104. It is noted that FIGS. 1 and 2 are schematic only and not to scale. Normally, the spindle diameter would be larger relative to the disk diameter. Moreover, arms 122-125 normally cannot point directly at the center of the disk.

A motor 126, commonly referred to as a "voice-coil motor," rotates actuator 121 back and forth along the directions of arrow B (FIG. 2) to move the heads 131, 132 along the path indicated by dashed arrow 201. The motion of actuator 121 thus changes both the radial and circumferential positions of heads 131, 132, but the circumferential positional change is relatively unimportant insofar as the platters are rotating. The motion of actuator 121 thus is used to control the radial position of heads 131, 132.

The location on surface 111 of platter 101 (the other surfaces are similar) of the aforementioned wedges is shown in FIG. 2. Each servo wedge 200 includes data identifying it by wedge index, track index, or sector number (to give an angular, tangential or circumferential position) and by data representing, at each point along a radius of the platter, the distance from spindle 104.

Figure 3:
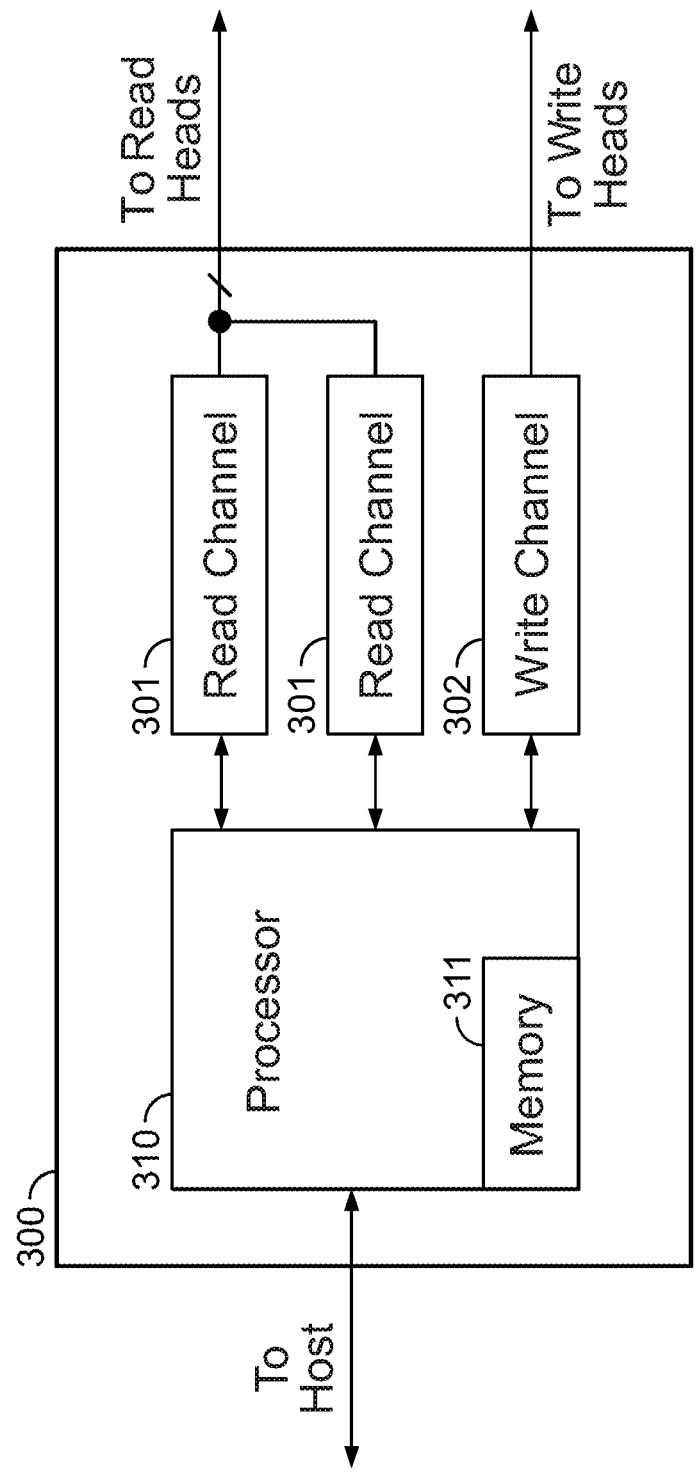
FIG. 3 is a diagram of a hard drive controller that may be used in a disk drive as in FIGS. 1 and 2 in implementations of the subject matter of this disclosure.

Each of read heads 131, 132 is connected to a read channel 301 of a hard drive controller 300 (there is a corresponding write channel 302) (FIG. 3). Hard drive controller 300 also includes a processor 310 and memory 311, as well as a connection 312 to a host processor (not shown). During normal disk operation, memory 311 may be used to store position error sensor (PES) data that indicates track position offsets. A servo control loop in hard drive controller 300 uses the PES data and the servo wedge data to keep the heads 131, 132 on track.

Figure 4:
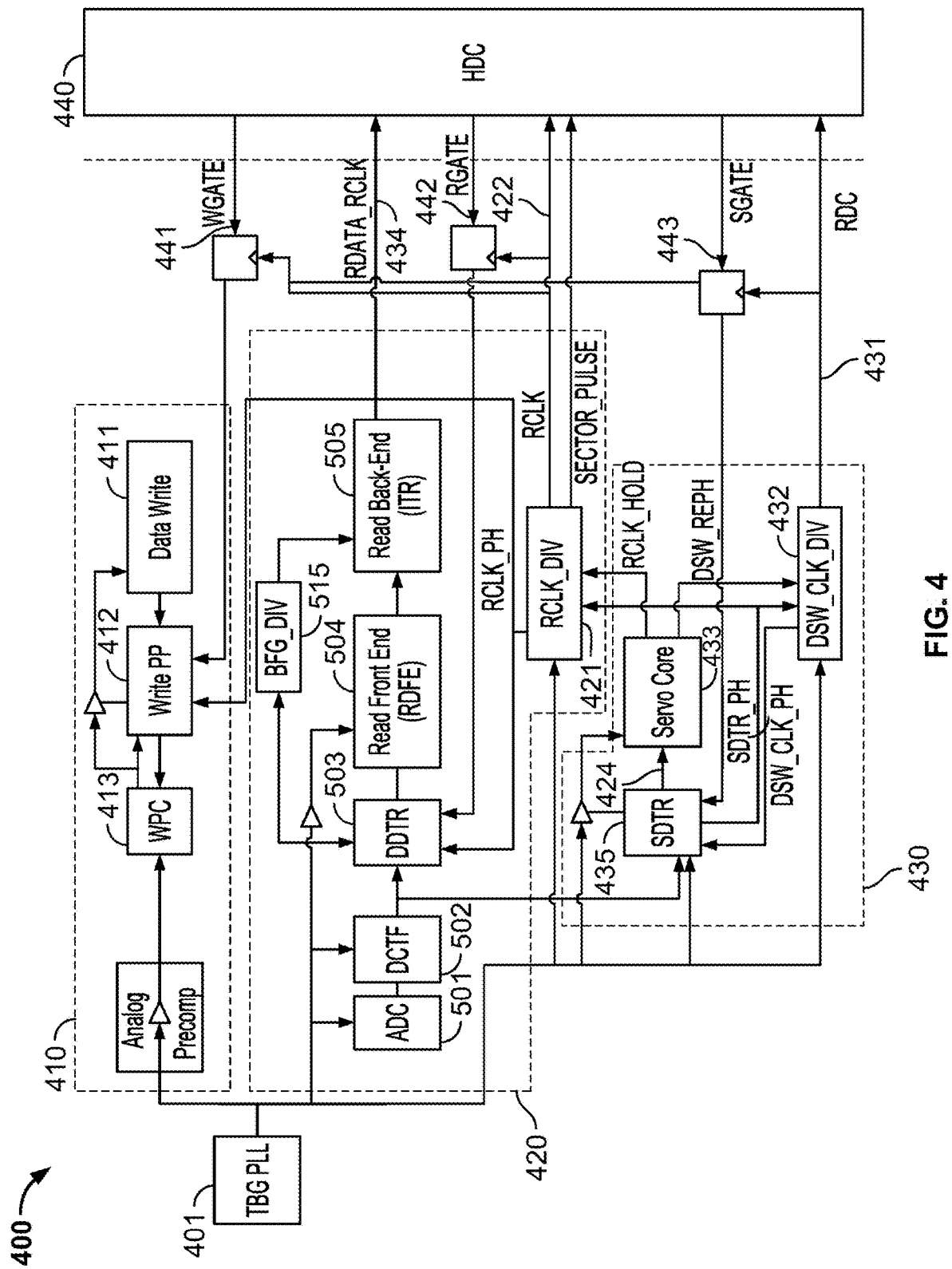
FIG. 4 is a diagram of a first implementation of data channel circuitry in accordance with the subject matter of this disclosure.

Data channel circuitry 400 in accordance with implementations of the subject matter of this disclosure is shown in FIG. 4, along with drive controller (HDC) circuitry 440, all of which may be at least partially implemented in processor 310. Data channel circuitry 400 may be divided, at least conceptually, into write channel circuitry 410, read channel circuitry 420, and servo circuitry 430, although the boundaries between write channel circuitry 410, read channel circuitry 420, and servo circuitry 430 may not be absolute. A single time-base generator (TBG) 401, which may be based on a PLL, provides the timing for all portions of data channel circuitry 400.

Each of write channel circuitry 410, read channel circuitry 420, and servo circuitry 430 operates according to respective gate signal—write gate (WGATE) 441, read gate (RGATE) 442 and servo gate (SGATE) 443—from HDC 440, but each gate signal is clocked according to its own respective clock derived from TBG 401. SGATE 443 is clocked by a disk synchronous write (DSW) clock signal 431, derived from TBG 401 by DSW clock divider (DSW_CLK_DIV) 432 which synchronizes with (i.e., compensates for frequency variations from) the disk rotation as described below.

DSW is typically used to adjust a sampling clock to match the disk spindle frequency. A DSW frequency offset is normally calculated from time between detection of two adjacent servo sync marks (servo sync-mark-found, or SSMF, signal). The locked time base helps to minimize any frequency difference between read and write operations. In a single time-base architecture as in implementations of the subject matter of this disclosure, instead of adjusting the PLL of TBG 401, the PLL of TBG 401 is allowed to continue to oscillate at a fixed frequency that may be asynchronous to disk rotation.

The measured SSMF difference is used to calculate a frequency offset that may added/subtracted to/from a clock or oversampling rate (see below) that is divided from TBG

401. A clock period scale factor SF may be calculated as the ratio of the actual wedge-to-wedge time $T_{wtw}$ to the period of the TBG clock:

$$SF = T_{wtw}/T_{tbg}$$

Because the PLL of TBG 401 is always oscillating at the same frequency, when a change is made to one of the derived clocks, there is no delay while the PLL converges. Rather, the derived clocks, which are derived digitally, can be changed by changing digital parameters. For example, digital continuous time filter (DCTF) 502 can be adjusted nearly instantaneously by changing a digital coefficient (several clock cycles may elapse before the change propagates through the system).

The frequency offset RCLK_HOLD is provided by servo core circuitry 433 to read clock divider (RCLK_DIV) 421 that provides a common clock (RCLK) 422 to read channel circuitry 420 and write channel circuitry 410. As seen in FIG. 4, there is no write clock separate from the read clock. Although a write gate signal (WGATE) 441 is generated by HDC 440 separately from read gate signal (RGATE) 442, both RGATE 442 and WGATE 441 are clocked by the clock (RCLK) 422 derived by read clock divider (RCLK_DIV) 421. RCLK 422 may therefore be referred to as a "symbol clock" rather than as a read clock or a write clock. Servo core circuitry 433 is clocked by a clock 424, output by servo digital timing recovery (SDTR) circuitry 435 and derived from TBG 401 (e.g., using digital timing recovery techniques such as those disclosed in copending, commonly-assigned U.S. patent application Ser. No. 17/659,703, filed Apr. 19, 2022, which is hereby incorporated by reference in its entirety).

Digital timing recovery uses an interpolation circuit to shift a sampling phase to a desired location. The phase of the clock may have only a loose relationship with disk angular position. In order to get a precise time/location as in the case of conventional timing recovery, each timestamp is adjusted based on the sampling phase from the DTR timing loop. The adjustment may be a simple subtraction.

As a result, the time unit of a timestamp is not a physical sampling bit (either servo or data), but a clock cycle count. However, a target timestamp value can be projected or calculated from the period of a physical sampling phenomenon. Therefore, with an appropriate frequency selection, the frequency can be an integer multiple of clock cycles per disk revolution.

In the implementations shown, HDC 440, which generates the various gate signals write gate (WGATE) 441, read gate (RGATE) 442 and servo gate (SGATE) 443, operates on several different clocks in including RCLK 422 (for read and write operations), servo clock 431 output by DSW clock divider 432, which is triggered by a servo sync-mark found (SSMF) signal, for servo operations, and back-end read clock (RDATA_RCLK) 434 for error correction operations. Nevertheless, insofar as all of those clocks are derived from TBG 401, they are all in the same clock domain, reducing jitter.

Figure 5:
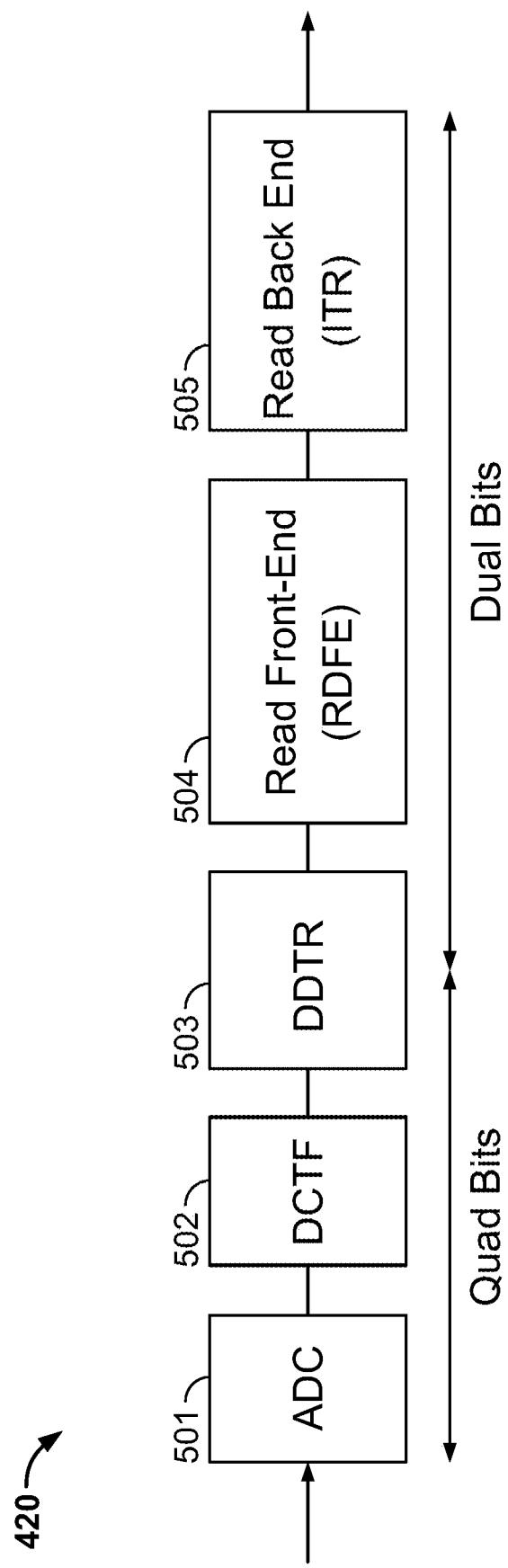
FIG. 5 is a diagram showing an implementation of the read channel portion of the data channel circuitry of FIG. 4.

On the read side, read channel circuitry 420, shown in detail in FIG. 5, includes an analog-to-digital converter 501, a digital continuous time filter 502 to equalize the digitized data, data digital timing recovery circuitry 503 to derive a lower frequency bit clock, read front-end 504 to process read data signals, and read back-end 505 to perform error correction. Read back-end 505 is clocked by RDATA_RCLK 434 output by back-end divider (BFG_DIV) 515 (FIG. 4) which replaces a typical back-end function generator. The remainder of read channel circuitry 420 is clocked by RCLK 422. Read back-end 505 need not be synchronous with the remainder of read channel circuitry 420 and, as noted above, the back-end clock RDATA_RCLK 434 may be so different from RCLK 422 that, even though the two clocks are rational multiples derived from the same time-base frequency, they may be effectively asynchronous.

On the write side, data write circuitry 411 may be a data sector write bit sequence generator as may typically be used for data writing. Data write circuitry 411 encodes user data into a bit sequence for writing, and may encapsulate the bit sequence in a preamble and postamble, along with reference point data such as sync marks. Write post-processor circuitry (WRITE-PP) 412 operates on the write data bit sequence to perform phase pre-processing, single bit filtering, and final phase generation. Write pre-compensation circuitry (WPC) 413 shifts the position of signal transitions to align with the write clock edge to optimize data read error rate, and may also be used to make additional adjustments to achieve the desired write pattern frequency.

In order facilitate such adjustments, so that write frequency modification (as disclosed, for example, in commonly-assigned U.S. Pat. No. 10,971,187, which is hereby incorporated by reference in its entirety) may be performed to derive rational, non-integer multiple of the time base frequency, the time base frequency may have been doubled at digital continuous time filter 502 to achieve bit repetition. Therefore, in read channel circuitry 420, analog-to-digital converter 501, a digital continuous time filter 502, and the input side of data digital timing recovery circuitry 503 may operate in a quad-bit mode in which the data path is quadrupled, with oversampling—e.g., by a factor of 2—increasing the effective frequency. The remainder of read channel circuitry 420, including the output end of data digital timing recovery circuitry 503, read front-end 504, and read back-end 505, does not need the higher bit rate, and therefore, to save power, can operate in a dual-bit mode in which the data path is doubled rather than quadrupled, with no oversampling in effect.

Figure 6:
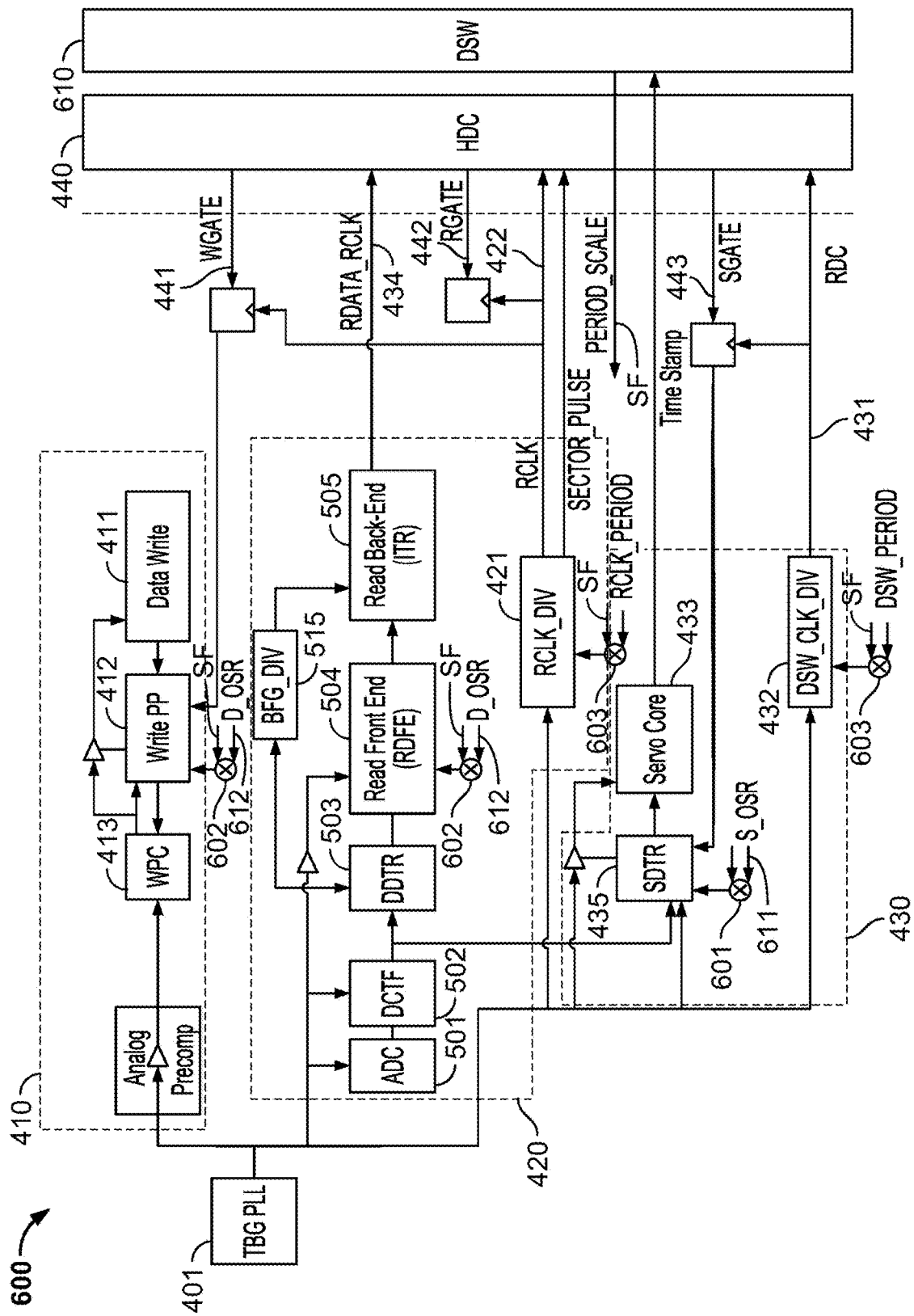
FIG. 6 is a diagram of a second implementation of data channel circuitry in accordance with the subject matter of this disclosure.

FIG. 6 shows a modification 600 of the circuitry 400 of FIG. 4, configured to apply the scale factor SF derived, as described above, by DSW circuitry 610. Circuitry 600 is identical to circuitry 400 except that servo digital timing recovery circuitry 435 has a scaled input 601 at which servo oversampling rate 611 is scaled (multiplied) by scale factor SF. Similarly, each of read front-end circuitry 504 and WRITE-PP circuitry 412 have scaled inputs 602 at which data oversampling rate 612 is scaled (multiplied) by scale factor SF. In addition, each of digital clock dividers DSW_CLK_DIV 432 and RCLK_DIV 421 has a respective scaled input 603 at which the respective clock period is scaled (multiplied) by scale factor SF.

Figure 7:
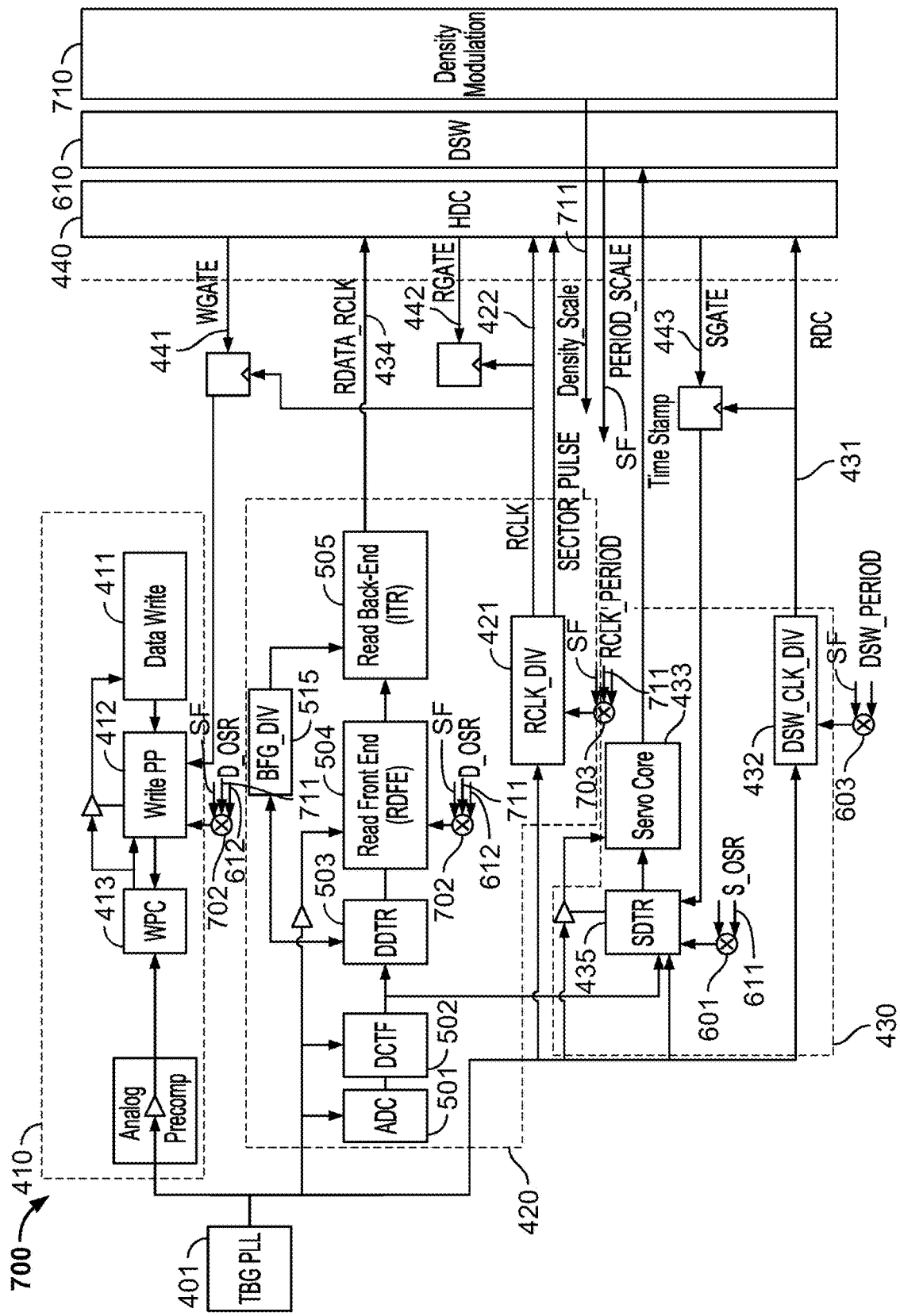
FIG. 7 is a diagram of a third implementation of data channel circuitry in accordance with the subject matter of this disclosure.

A further modification 700 shown in FIG. 7 may be used to implement write density modulation in which the write frequency of a stream of data to be written is altered dynamically to account for local variations of the quality of the recording surface of the disk storage medium—i.e., some higher-quality areas of the disk surface may be able to accommodate higher data densities than some lower-quality areas of the disk surface. To implement such a variable write density scheme under the control of density modulation circuitry 710, each of read front-end circuitry 504 and WRITE-PP circuitry 412 have scaled inputs 702 at which data oversampling rate 612 is scaled (multiplied) by scale factor SF as well as by write density scale factor 711. In addition, digital clock divider RCLK_DIV 421 has a scaled input 703 at which the respective clock period is scaled (multiplied) by scale factor SF as well as by write density scale factor 711. Areas of the disk could be classified in initial testing or calibration as supporting higher or lower read frequencies, and those areas could be correlated to individual sectors. The write density scale factor 711 could be altered as the write head passes through different sectors, depending on how each sector was classified.

Figure 8:
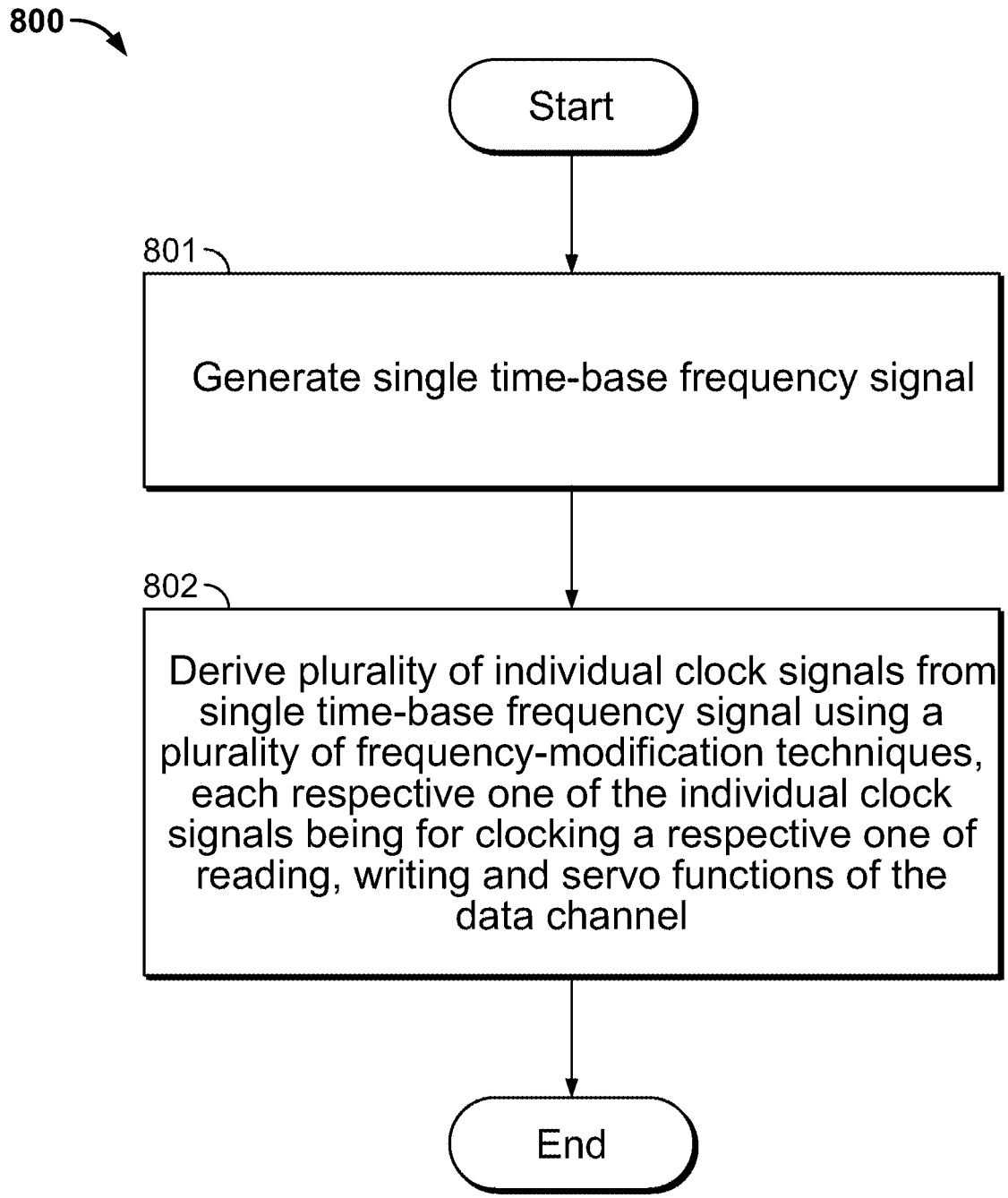
FIG. 8 is a flow diagram showing a method in accordance with implementations of the subject matter of this disclosure.

A method 800 according to implementations of the subject matter of this disclosure is diagrammed in FIG. 8. Method 800 begins at 801 where a single time-base frequency signal is generated. At 802, a plurality of individual clock signals are derived from the single time-base frequency signal, using a plurality of frequency-modification techniques, each respective one of the individual clock signals being for clocking a respective one of reading, writing and servo functions of the data channel. Method 800 then ends.

Thus it is seen that a method and apparatus for reduction of jitter in read channel operations, by using a single unified time base to generate the frequencies for reading, writing and servo operations, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method of clocking a data channel of a disk storage device having a rotational frequency, the method comprising:
   generating a single time-base frequency signal based on the rotational frequency;
   deriving from the single time-base frequency signal, using a plurality of digital frequency-modification techniques, a plurality of individual clock signals, each respective one of the individual clock signals being for clocking a respective one of reading, writing and servo functions of the data channel, wherein:
   one of the digital frequency-modification techniques is a write pattern frequency modification technique requiring bit repetition for modification of a write phase; the method further comprising:
   oversampling the time-base frequency in portions of the data channel to provide the bit repetition.

2. The method of clocking a data channel according to claim 1 further comprising:
   detecting a deviation of the single time-base frequency from the rotational frequency; and
   compensating for the deviation.

3. The method of clocking a data channel according to claim 2 wherein:
   detecting the deviation of the single time-base frequency from the rotational frequency comprises detecting a time interval between servo wedges; and
   compensating for the deviation comprises:
      determining a scale factor based on a relationship of the deviation to a period of the single time-base frequency, and
      applying the scale factor to each individual clock signal in the plurality of clock signals.

4. The method of clocking a data channel according to claim 2 wherein:
   detecting a deviation of the single time-base frequency from the rotational frequency comprises detecting a servo sync mark at a time other than a time expected based on the rotational frequency; and
   compensating for the deviation comprises deriving a phase differential from the deviation and applying the phase differential to the single time-base frequency.

5. The method of clocking a data channel according to claim 2 wherein:
   detecting a deviation of the single time-base frequency from the rotational frequency comprises detecting a skipped clock using digital timing recovery; and
   compensating for the deviation comprises deriving a phase differential from the deviation and applying the phase differential to the single time-base frequency.

6. The method of clocking a data channel according to claim 1 further comprising adjusting a write pattern frequency on a per-sector basis to account for variations in disk surface quality.

7. The method of clocking a data channel according to claim 1 wherein one of the digital frequency-modification techniques is a digital timing recovery technique.

8. The method of clocking a data channel according to claim 1 wherein one of the digital frequency-modification techniques is a digital frequency division technique.

9. A storage device, comprising:
   a storage disk, having a rotational frequency, on which data is written; and
   a data channel including clock circuitry, the clock circuitry comprising:
      circuitry configured to generate a single time-base frequency signal based on the rotational frequency, and
      digital frequency-modification circuitry configured to derive from the single time-base frequency signal, using a plurality of digital frequency-modification techniques, a plurality of individual clock signals, each respective one of the individual clock signals being for clocking a respective one of reading, writing and servo functions of the data channel, wherein the digital frequency-modification circuitry comprises:
   oversampling circuitry to provide bit repetition in the time-base frequency in portions of the data channel, and
   write pattern frequency modification circuitry configured to operate on repetitive bits to modify a write phase.

10. The storage device of claim 9 wherein the circuitry configured to generate a single time-base frequency signal comprises a phase-locked loop.

11. The storage device of claim 9 further comprising:
    circuitry configured to detect a deviation of the single time-base frequency from the rotational frequency; and
    circuitry configured to compensate for the deviation.

12. The storage device of claim 11 wherein:
    the circuitry configured to detect the deviation of the single time-base frequency from the rotational frequency comprises circuitry configured to detect a time interval between servo wedges; and
    the circuitry configured to compensate for the deviation comprises:
       circuitry configured to determine a scale factor based on a relationship of the deviation to a period of the single time-base frequency, and
       circuitry configured to apply the scale factor to each individual clock signal in the plurality of clock signals.

13. The storage device of claim 11 wherein:
the circuitry configured to detect the deviation of the single time-base frequency from the rotational frequency comprises circuitry configured to detect a servo sync mark at a time other than a time expected based on the rotational frequency; and
the circuitry configured to compensate for the deviation comprises circuitry configured to derive a phase differential from the deviation and to apply the phase differential to the single time-base frequency.

14. The storage device of claim 11 wherein:
the circuitry configured to detect the deviation of the single time-base frequency from the rotational frequency comprises circuitry configured to detect a skipped clock using digital timing recovery; and
the circuitry configured to compensate for the deviation comprises circuitry configured to derive a phase differential from the deviation and to apply the phase differential to the single time-base frequency.

15. The storage device of claim 9 wherein the write pattern frequency modification circuitry is further configured to adjust a write pattern frequency on a per-sector basis to account for variations in disk surface quality.

16. The storage device of claim 9 wherein the digital frequency-modification circuitry comprises digital timing recovery circuitry.

17. The storage device of claim 9 wherein the digital frequency-modification circuitry comprises digital frequency division circuitry.

* * * * *